(12) United States Patent
Liou et al.

(10) Patent No.: US 6,436,765 B1
(45) Date of Patent: Aug. 20, 2002

(54) METHOD OF FABRICATING A TRENCHED FLASH MEMORY CELL

(75) Inventors: Ji-Wei Liou; Chih-Jen Huang, both of Hsin-Chu; Pao-Chuan Lin, Yun-Lin Hsien, all of (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 09/779,540

(22) Filed: Feb. 9, 2001

(51) Int. Cl.$^7$ ............................................. H01L 21/336
(52) U.S. Cl. ..................... 438/259; 438/244; 438/250; 438/255; 438/265; 438/270; 438/280; 438/315
(58) Field of Search ................................ 438/244, 245, 438/246, 247, 248, 249, 250, 251, 252, 253, 254, 255, 256, 257, 258, 259, 260, 261, 262, 263, 264, 265, 266–280, 315

(56) References Cited

U.S. PATENT DOCUMENTS

| | | | | |
|---|---|---|---|---|
| 5,343,063 A | * | 8/1994 | Yuan et al. | 257/317 |
| 6,002,151 A | * | 12/1999 | Liu et al. | 257/316 |
| 6,048,768 A | * | 4/2000 | Ding et al. | 438/264 |
| 6,093,606 A | * | 7/2000 | Lin et al. | 438/259 |
| 6,118,135 A | * | 9/2000 | Gonzalez et al. | 257/3 |
| 6,124,608 A | * | 9/2000 | Liu et al. | 257/315 |
| 6,157,058 A | * | 12/2000 | Ogura | 257/315 |
| 6,177,315 B1 | * | 1/2001 | Bergemont et al. | 438/258 |
| 6,232,632 B1 | * | 5/2001 | Liu | 257/315 |
| 6,239,465 B1 | * | 5/2001 | Nakagawa | 257/331 |
| 6,248,631 B1 | * | 6/2001 | Huang et al. | 438/260 |
| 6,248,633 B1 | * | 6/2001 | Ogura et al. | 438/267 |
| 6,258,668 B1 | * | 7/2001 | Lee et al. | 438/262 |
| 6,259,131 B1 | * | 7/2001 | Sung et al. | 257/315 |
| 6,291,855 B1 | * | 9/2001 | Chang et al. | 257/316 |
| 6,323,516 B1 | * | 11/2001 | Wang et al. | 257/317 |
| 6,352,890 B1 | * | 3/2002 | Sutcliffe | 438/241 |

FOREIGN PATENT DOCUMENTS

| | | | | |
|---|---|---|---|---|
| JP | 2000252448 A | * | 9/2000 | H01L/21/8247 |
| JP | 2000315768 A | * | 11/2000 | H01L/21/822 |

* cited by examiner

*Primary Examiner*—Caridad Everhart
*Assistant Examiner*—Renzo N. Rocchegiani
(74) *Attorney, Agent, or Firm*—Winston Hsu (57) ABSTRACT

A method of fabricating a trenched flash memory cell is provided. A plurality of shallow trench isolation structures are formed to enclose at least an active area in a silicon substrate. A doped region is formed in the silicon substrate, followed by the deposition of an isolation layer on the silicon substrate. A first photo and etching process (PEP) is performed to form two trenches within the active area. A tunnel oxide layer, a floating gate, and ONO dielectric layer are formed in the trenches, respectively. A doped polysilicon layer is then formed on the silicon substrate to fill the trenches, followed by the removal of a portion of the doped polysilicon layer to form two controlling gates in the active area. Next, a self-alignment common source is formed between the two controlling gates and a plurality of spacers are formed on either side of each controlling gate. Finally, a silicide layer is formed on the surfaces of the controlling gates and the common source.

16 Claims, 6 Drawing Sheets

METHOD OF FABRICATING A TRENCHED FLASH MEMORY CELL

BACKGROUND OF THE INVENTION

1. Field of the Invention

The present invention relates to a method of fabricating a trenched flash memory cell, and more particularly, to a method of fabricating a trenched flash memory cell to raise the coupling ratio (CR) and hence improve the electrical performance of the element.

2. Description of the Prior Art

A stacked-gate flash memory cell comprises a floating gate for storing electric charges, a controlling gate for controlling the charging of the floating gate, and an ONO (oxide-nitride-oxide) dielectric layer positioned between the floating gate and the controlling gate. Similar to a capacitor, the flash memory stores electric charges in the floating gate to represent a digital data bit of "1", and removes charge from the floating gate to represent a digital data bit of "0".

Figure 1:
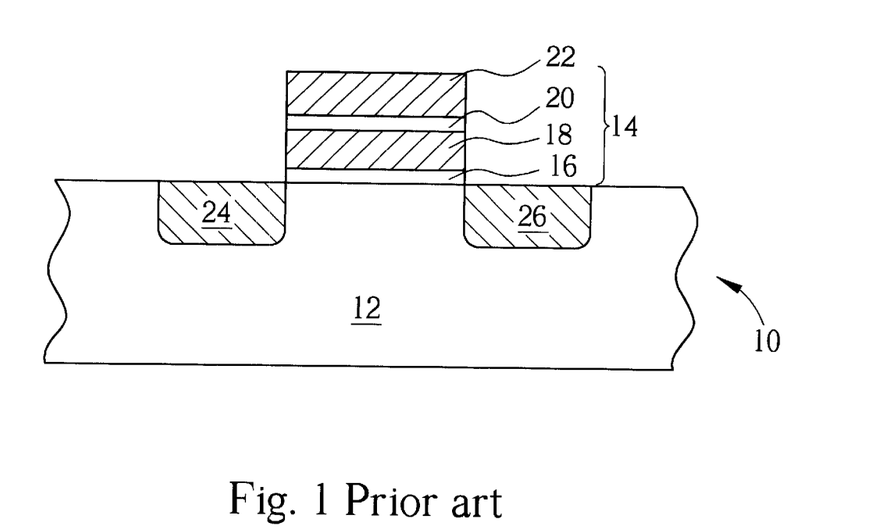
FIG. 1 is a cross-sectional diagram of a conventional flash memory cell.

Please refer to FIG. 1. FIG. 1 is a cross-sectional diagram of a conventional stacked-gate flash memory cell 10. As shown in FIG. 1, the flash memory cell 10 comprises a stacked gate 14 positioned on the surface of a silicon substrate 12, a source 24 and drain 26 positioned adjacent to each side of the stacked gate 14. The stacked gate 14 is composed of a tunnel oxide layer 16, a floating gate 18, an ONO dielectric layer 20 and a controlling gate 22, respectively. By virtue of channel hot electrons (CHE) effects, the hot electrons are injected into the floating gate 18 from the drain 26 through the tunnel oxide layer 16 so as to achieve data storage. A Fowler Nordheim tunneling technique is used for data erase, which involves grounding of the controlling gate 22 or applying a negative voltage to the controlling gate 22. As a result, the drain 26 is highly biased so as to expel the electrons trapped in the floating gate 18.

In general, a coupling ratio (CR value) is used as an index to evaluate the performance of a flash memory cell. Assuming that $C_1$ is the capacitance between the floating gate 18 and the controlling gate 22, $C_2$ is the capacitance between the floating gate 18 and the source 24, $C_3$ is the capacitance between the floating gate 18 and the silicon substrate 12, and $C_4$ is the capacitance between the floating gate 18 and the drain 26, the CR value of the flash memory cell 10 is defined as:

$$CR=C_1/(C_1+C_2+C_3+C_4)$$

Wherein, the higher the coupling ratio, the better the performance of the flash memory cell. According to the above equation, one method of increasing the CR value is to increase the capacitor surface between the floating gate 18 and the controlling gate 22, as this surface is proportional to the capacitance $C_1$. However, surface enlargement is limited as the line width of either the floating gate 18 or the controlling gate 22 is defined to increase the element integration. Thus, difficulty occurs in raising both the capacitance and accessing speed of the flash memory cell 10 through the increase of the surface area of the floating gate 18 or the controlling gate 22. In addition, although the stacked-gate flash memory cell 10 enhances integration, it is, however, prone to over-erasing.

SUMMARY OF THE INVENTION

It is therefore an objective of the present invention to provide a method of fabricating a trenched flash memory cell to efficiently increase the CR value and simultaneously improve the electrical performance of the elements.

In a preferred embodiment of the present invention, a plurality of shallow trench isolation (STI) structures are formed to enclose at least an active area in a silicon substrate. Next, a first ion implantation process is performed on the silicon substrate to form a doped region, followed by the deposition of an isolation layer on the surface of the silicon substrate. A first photo and etching process (PEP) is performed to form two trenches within the active area. A tunnel oxide layer, a floating gate, and an ONO dielectric layer are then formed, respectively, on the inner surface of the trenches. Subsequently, a doped polysilicon layer is formed on the silicon substrate to fill the trenches. A second PEP is performed to remove a portion of the doped polysilicon layer so as to form two controlling gates in the active area. A self-alignment source (SAS) etching process is then performed to form a common source between the two controlling gates. A plurality of spacers are then formed on the either side of each controlling gate. At last, a self-alignment silicide (salicide) process is performed to form a silicide layer on the surfaces of both the controlling gates and the common source to finish the fabrication of the trenched flash memory cell of the present invention.

It is an advantage of the present invention that the trench structure buried in the silicon substrate is used to form the stacked gate of the stacked-gate flash memory cell. The coupling surface area between the floating gate and the controlling gate is thus efficiently increased by increasing the depth or width of the stacked gate buried within the silicon substrate. As a result, integration of the elements formed thereafter on the silicon substrate is not sacrificed, and the accessing speed of the flash memory cell is raised.

These and other objectives of the present invention will no doubt become obvious to those of ordinary skill in the art after reading the following detailed description of the preferred embodiment, which is illustrated in the various figures and drawings.

DETAILED DESCRIPTION OF THE PREFERRED EMBODIMENT

Figure 2:
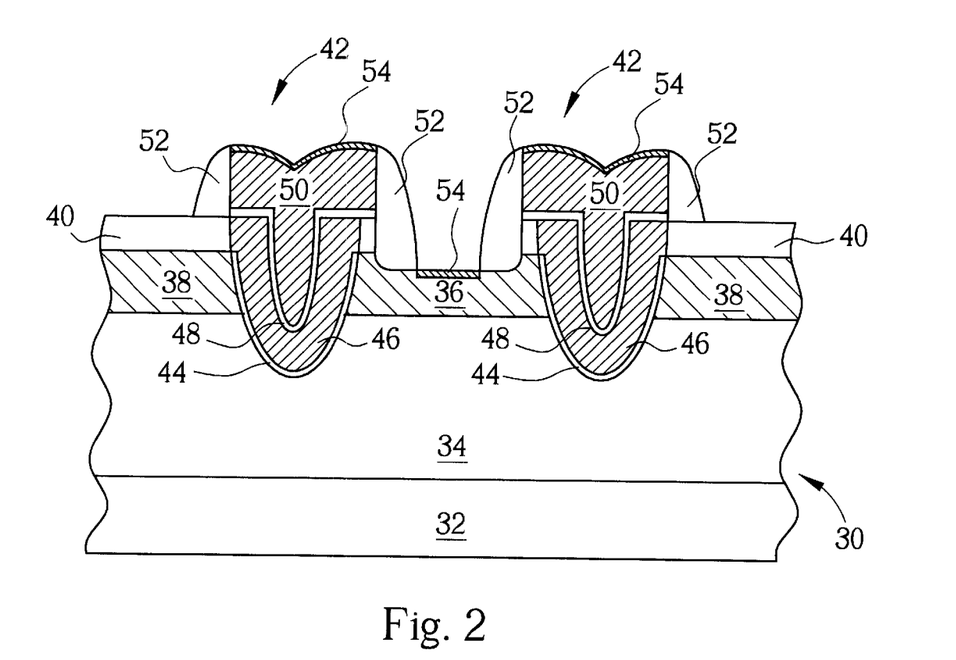
FIG. 2 is a cross-sectional diagram of a trenched flash memory cell according to the present invention.

Please refer to FIG. 2. FIG. 2 is a cross-sectional diagram of a trenched flash memory cell 30 formed on a silicon substrate 32 according to the present invention. As shown in FIG. 2, the silicon substrate 32 is a silicon-on-insulator (SOI) substrate or a single crystal silicon substrate, over which a memory array area and a periphery circuits region are predetermined. At least a P-well 34 and a N-well (not shown) are formed within the silicon substrate 32 in the memory array area.

In a better embodiment of the present invention, the trenched flash memory cell 30 comprises two stacked gates 42 buried in the P-well 34 within the silicon substrate 32, a common source 36 positioned on the surface of the silicon substrate 32 between the two stacked gates 42, two drains 38 positioned on the silicon substrate 32 at an opposing side of each stacked gate 42, and a dielectric layer 40 positioned on the surfaces of the common source 36 and the drains 38 to isolate the stacked gate 42 from the common source 36 and the drains 38. The stacked gate 42 is composed of a tunnel oxide layer 44, a floating gate 46, an ONO dielectric layer 48, and a controlling gate 50 stacked, respectively, and partially buried in the silicon substrate 32. In addition, a spacer 52 is formed on either side of each stacked gate 42. A silicide layer 54 is also formed on the surfaces of the stacked gates 42 and the common source 36 to reduce resistance.

Figure 3:
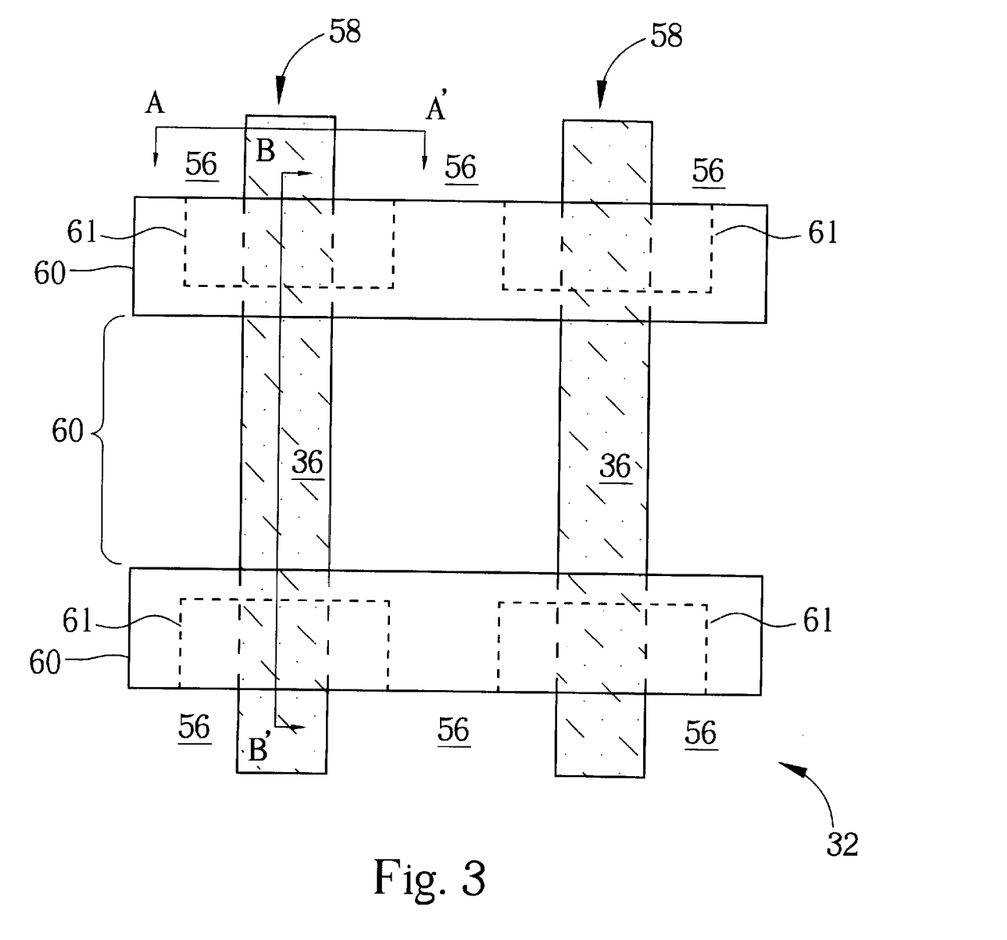
FIG. 3 is a top view of the trenched flash memory cell shown in FIG. 2.

Please refer to FIG. 3. FIG. 3 is a top view of the trenched flash memory cell 30 shown in FIG. 2. As illustrated in FIG. 3, a plurality of shallow trench isolation structures 56 are formed to produce two active areas 58 within the silicon substrate 32. The active areas 58, comprising a plurality of trenches 61 buried in the silicon substrate 32, are perpendicular to a plurality of parallel word lines 60. Furthermore, a bit line 62 is positioned between two word lines 60.

Figure 4:
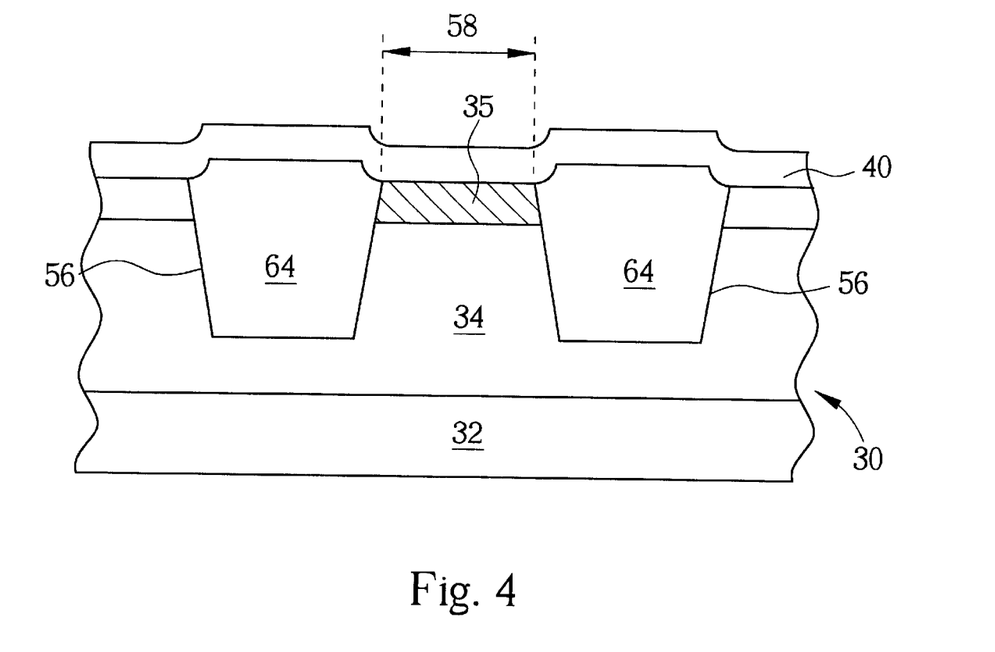
FIG. 4 to FIG. 11 are schematic diagrams of a method of fabricating a trenched flash memory cell according to the present invention.

Please refer to FIG. 4 to FIG. 11. FIG. 4 to FIG. 11 are schematic diagrams of a method of fabricating the trenched flash memory cell 30 on the silicon substrate 32 according to the present invention. As shown in FIG. 4, which is a sectional view along line AA' of FIG. 3, the present invention method first involves the use of a shallow trench isolation process. During this process, conventional photolithographic and etching methods are used to form a plurality of shallow trench isolation structures 56 in the silicon substrate 32. An active area 58, enclosed by the shallow trench isolation structures 56, is then defined on the surface of the silicon substrate 32. Thereafter, a chemical vapor deposition (CVD) process is performed to form an oxide layer 64 to fill each of the shallow trench isolation structures 56. A photoresist layer (not shown) is formed to cover both the periphery circuits region and the N-well portion in the memory array area, followed by a first ion implantation process to form a buried N$^+$ doped region 35 on the surface of the P-well 34 within the active area 58. An isolation layer 40 is then formed on the surface of the silicon substrate 32. The isolation layer 40 may be a silicon dioxide layer formed by a plasma-enhanced chemical vapor deposition (PECVD) method.

Figure 5:
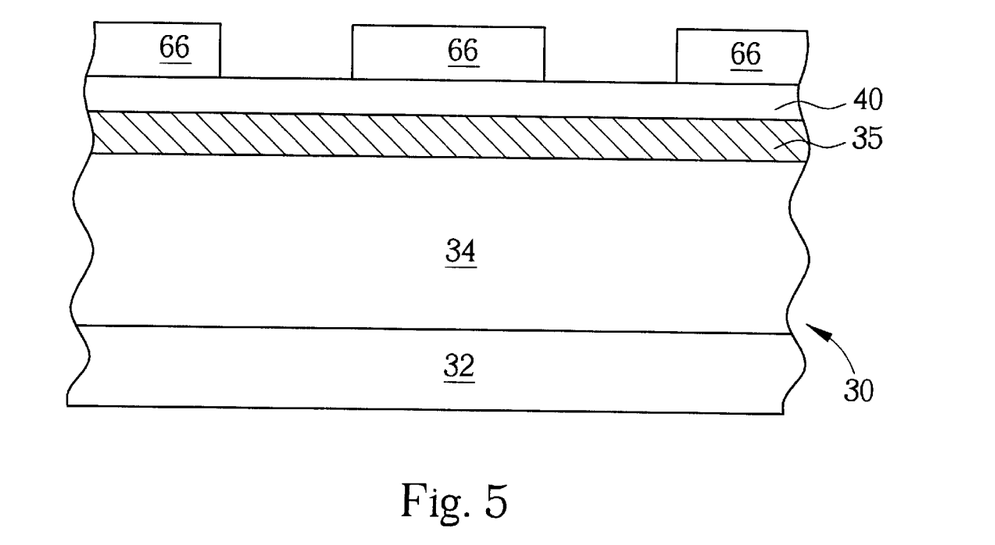
Figure 6:
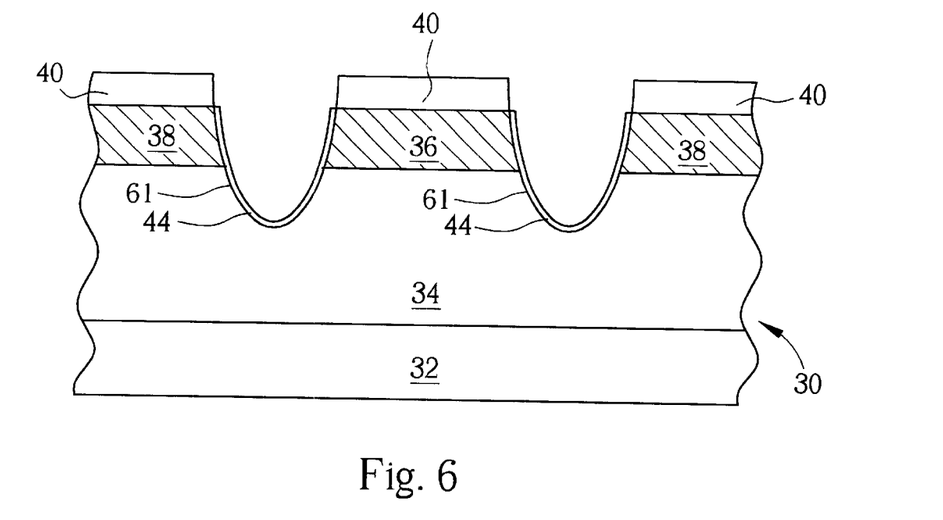

As shown in FIG. 5, which is a sectional view along line BB' of FIG. 3, a photoresist layer 66 is subsequently formed on the surface of the isolation layer 40 and patterned by a photolithographic process to predetermine the position of two trenches 61. As shown in FIG. 6, an etching process is performed using the photoresist layer 66 as a mask to both remove the isolation layer 40 to a predetermined depth within the P-well 34 and to form two trenches 61 within the P-well 34. The two trenches 61 divide the doped region 35 into a common source 36 positioned between the two trenches 61, and two drains 38 positioned an opposing side of each trench 61. A thermal oxidation process is then performed to grow a silicon dioxide layer on the inner surface of the trenches 61 so as to function as a tunnel oxide layer 44.

Figure 7:
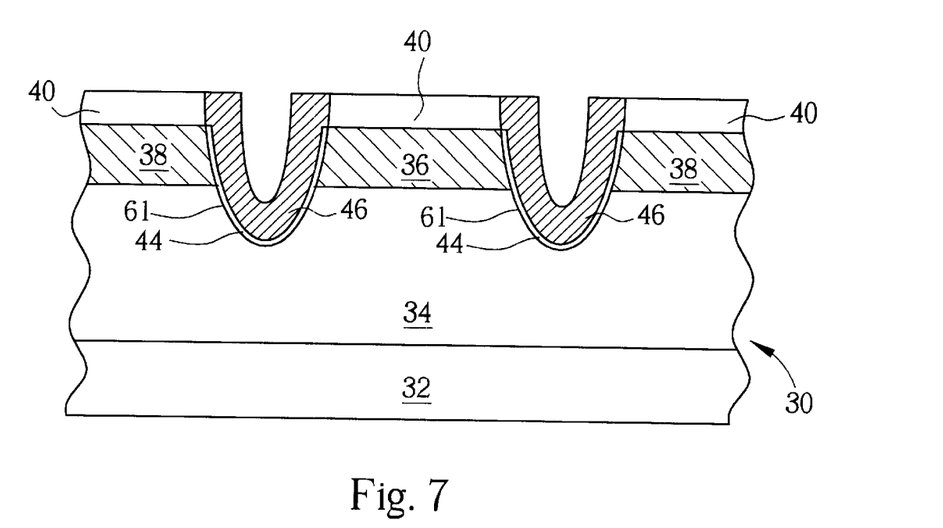

Next, as shown in FIG. 7, a CVD process is used to deposit a doped polysilicon layer (not shown) on the surface of the silicon substrate 32. To avoid completely filling the trenches 61, the thickness of deposition of the doped polysilicon layer is controlled to be approximately half to three quarters of the radius of the trench 61. Thereafter, the doped polysilicon layer is removed except in the region within the trenches 61 so as to form a floating gate 46 in the trenches 61.

Figure 8:
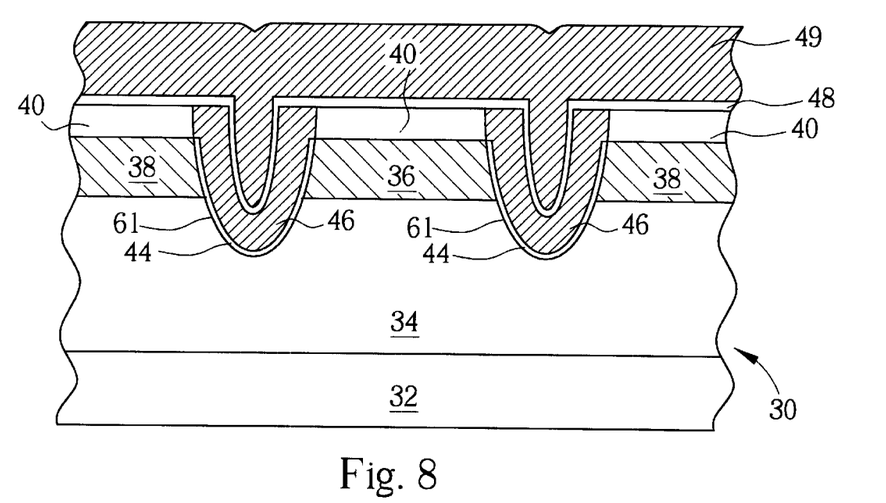
Figure 9:
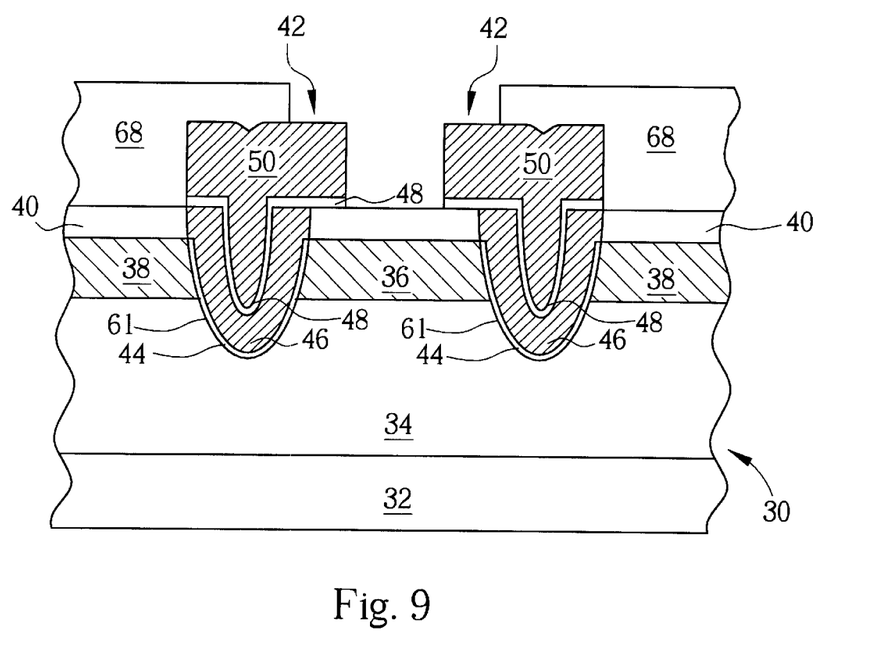

As shown in FIG. 8, an oxide-nitride-oxide (ONO) process is performed so as to form an ONO dielectric layer 48 on the silicon substrate 32 in the memory array area. A CVD process is then used to deposit another doped polysilicon layer 49 on the entire surface of the silicon substrate 32, including the silicon substrate 32 in the periphery circuits region. The doped polysilicon layer 49 fills in the trenches 61. Thereafter, a photo and etching process (PEP) is performed to etch a portion of the doped polysilicon layer 49 as well as to form two controlling gates 50 above each of the two trenches 61, as shown in FIG. 9. In other words, two word lines 60 as shown in FIG. 3 are formed crossing the active areas 58. As well, the PEP simultaneously forms a plurality of gates (not shown) in the periphery circuits region. Thereafter, a photoresist layer 68 is formed on the surface of the silicon substrate 32, followed by a photolithographic process to form an opening in the photoresist layer 68 to expose the isolation layer 40 in the region between the two controlling gates 50.

Figure 10:
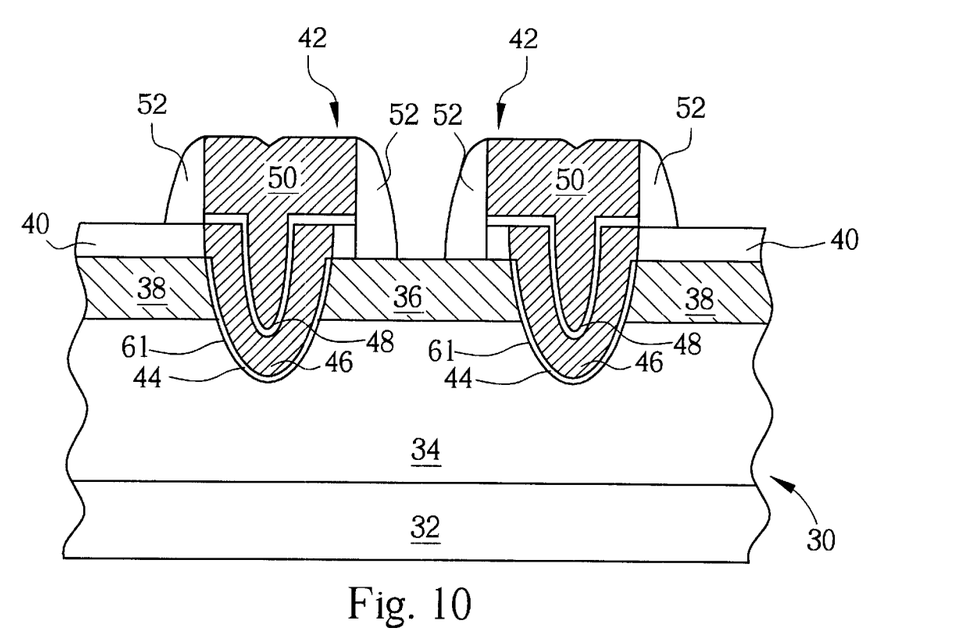

Next, as shown in FIG. 10, a self-alignment source (SAS) etching process is performed using the patterned photoresist layer 68 as a mask to remove the isolation layer 40 positioned between the two controlling gates 50 down to the surface of the common source 36. The method of removing the isolation layer 40 involves using a fluorocarbon plasma to selectively etch between silicon dioxide (the isolation layer 40) and doped polysilicon (the common source 36). And if necessary, a portion of the common source 36 is over etched to ensure the complete removal of the isolation layer 40 between the two controlling gates 50. In addition, the silicon dioxide filled in the shallow trench isolation structures 56 adjacent to the common sources 36, as shown in FIG. 3, is also selectively removed down to the surface of the silicon substrate 32 during this process.

Thereafter, the photoresist layer 68 is again used as a mask to perform a second ion implantation process, using the N-type dopants such as arsenic atoms to heavily implant the common source 36, to finish fabrication of the stacked gate 42. The photoresist layer 68 is then removed, followed by the deposition of a silicon nitride layer (not shown). Next, an anisotropic etching process is performed to etch back a portion of the silicon nitride layer so as to form a spacer 52, using the remaining silicon nitride layer, on either vertical sidewall of each stacked gate 42.

Figure 11:
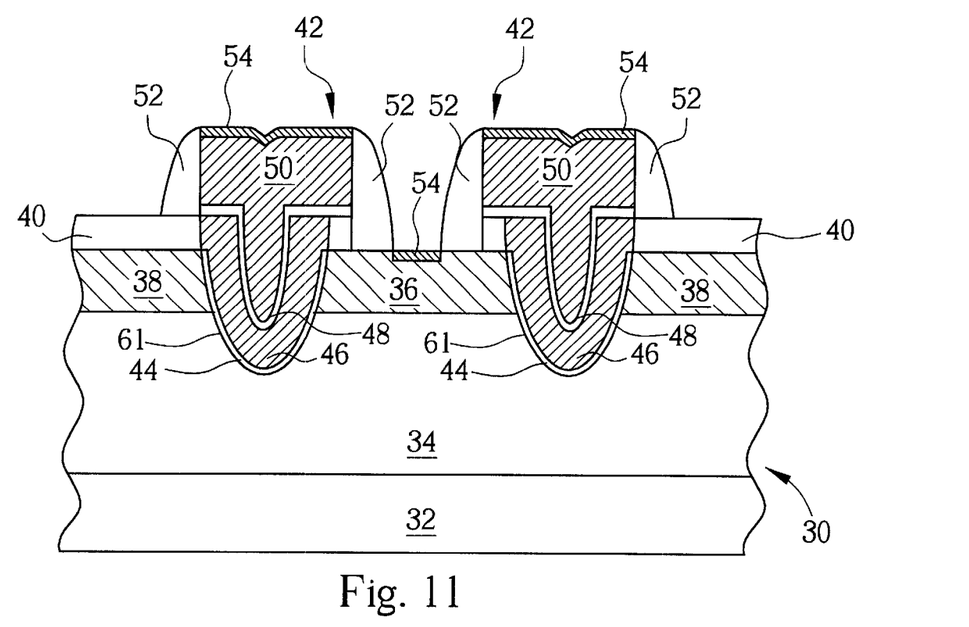

At last, as shown in FIG. 11, a titanium (Ti), cobalt (Co), nickel (Ni) or tungsten (W) metal layer (not shown) is formed on the surface of the silicon substrate 32. A thermal processing is then used to induce a reaction between the metal layer and the silicon in the common source 36, so that a self-alignment silicide (salicide) layer 54 is formed to function in reducing sheet resistance. Simultaneously, the salicide layer 54 is also formed on the silicon substrate 32 between the common sources 36, connecting with the salicide layer 54 positioned atop each of the common sources 36 to form the bit line 62, as shown in FIG. 3, to complete the fabrication of the trenched flash memory cell 30 of the present invention.

The present invention method uses the PEP of forming the trenches 61 to simultaneously form a self-alignment source 36 between the two trenches 61. Furthermore, the active areas 58 not occupied by the stacked gate 42 and the common source 36 automatically form the drains 38. As a result, subsequent photolithographic processes are unnecessary to define the drain 38 and source 36. As well, the source 36 and drain 38 of the trenched flash memory cell 30 horizontally surround the floating gate 46 such that the channel length between the floating gate 46 and the source 36/drain 38 is increased. As a result, the Fowler Nordheim tunneling technique facilitates both data storage and removal during operation of the trenched flash memory cell 30 by injecting electrons into the floating gate 46 or neutralizing the electrons in the floating gate 46. For example, when the controlling gate 50 is applied a high voltage, the drain 38 is negatively biased and the source 36 is floated, electrons are emitted from the drain 38 into the floating gate 46 to be stored. Conversely, when the controlling gate 50 is grounded or negatively biased, the source 36 is applied a high voltage and the drain 38 is floated, electrons stored in the floating gate 46 are ejected.

In contrast to the prior art of fabricating the flash memory cell, the method of the present invention uses a trench structure buried in the silicon substrate to form the stacked gate. Hence, the coupling surface area between the floating gate and the controlling gate is increased via the increase in depth or width of the stacked gate buried in the silicon substrate. Most importantly, integration of the elements subsequently formed on the substrate is not affected and the accessing speed of the flash memory cell is increased. In addition, the present invention uses a self-aligned technique to form the common source and the drains, and thus, prevents damage resulting from the conventional source/drain process. Also, the present invention forms the salicide layer on the surface of both the gate and the source to reduce resistance to improve the electrical performance and the quality of the flash memory cell.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A method of fabricating a trenched flash memory cell, the method comprising:

providing a silicon substrate, the silicon substrate having both a defined memory array area and a periphery circuits region;

performing a shallow trench isolation (STI) process to form a plurality of shallow trench isolation structures in the silicon substrate, and at least a defined active area enclosed by the shallow trench isolation structures;

performing a first ion implantation process on the silicon substrate in the memory array area so as to form a doped region;

forming an isolation layer on the surface of the silicon substrate;

performing a first photo and etching process (PEP) to remove a portion of both the isolation layer and the silicon substrate so as to form two trenches in the active area;

forming a tunnel oxide layer and a floating gate, respectively, on the inner surface of each trench;

forming a dielectric layer on the surface of the floating gates;

forming a doped polysilicon layer on the silicon substrate to fill the trenches;

performing a second photo and etching process to remove a portion of the doped polysilicon layer so as to simultaneously form two controlling gates in the active area and a plurality of gates in the periphery circuits region;

performing a self-alignment source (SAS) etching process to etch the portion of the isolation layer between the two controlling gates down to the surface of the doped region so that the doped region positioned between the two controlling gates is used as a common source;

forming a plurality of spacers on either side of each controlling gate; and performing a self-alignment silicide (salicide) process to form a silicide layer on the common source and each controlling gate;

wherein the doped region, not occupied by the controlling gates and the common source, in the active area is defined as a drain of the trenched flash memory cell.

2. The method of claim 1 wherein the silicon substrate is a silicon-on-insulator (SOI) substrate or a single crystal silicon substrate.

3. The method of claim 1 wherein a P-well is located in the silicon substrate within the memory array area.

4. The method of claim 3 wherein the doped region is a buried $N^+$ doped region.

5. The method of claim 1 wherein the dielectric layer is an oxidized-silicon nitride-silicon oxide (ONO) dielectric layer.

6. The method of claim 1 wherein the floating gate is composed of doped polysilicon.

7. The method of claim 1 wherein a second ion implantation process is performed after the SAS etching process, and using the SAS as a mask.

8. The method of claim 1 wherein programming and erasing over of the trenched flash memory cell involves the use of the Fowler Nordheim tunneling effect.

9. A method of fabricating a trenched flash memory cell, the method comprising:

providing a silicon substrate, the silicon substrate having both a defined memory array area and a periphery circuits region;

performing a shallow trench isolation (STI) process to form a plurality of shallow trench isolation structures in the silicon substrate and to form a plurality of arrayed active areas enclosed by the shallow trench isolation structures;

performing a first ion implantation process on the silicon substrate in the memory array area so as to form a doped region;

forming an isolation layer on the surface of the silicon substrate;

performing a first photo and etching process (PEP) to remove a portion of both the isolation layer and the silicon substrate so as to form two disconnecting trenches in each active area;

forming a tunnel oxide layer and a floating gate, respectively, on the inner surface of each trench;

forming a dielectric layer on the surface of the floating gates;

forming a doped polysilicon layer on the silicon substrate to fill the trenches;

performing a second photo and etching process to remove a portion of the doped polysilicon layer so as to simultaneously form a plurality of gates in the periphery circuits region and a plurality of word lines in the memory array area, wherein each of the active areas is crossed by two disconnecting word lines and the overlapping portion of each word line with the floating gate is defined as a controlling gate;

performing a self-alignment source (SAS) etching process to etch the portion of the isolation layer between the two controlling gates down to the surface of the doped region so that the doped region positioned between the two controlling gates is used as a common source, wherein the shallow trench isolations adjacent to the common source are simultaneously etched down to the surface of the silicon substrate during this process;

forming a plurality of spacers on either side of each word line; and performing a self-alignment silicide (salicide) process to form a silicide layer on the surfaces of the common source and the silicon substrate adjacent to the common source so as to form a plurality of continuous silicide lines to function as bit lines;

wherein the doped region, not occupied by the controlling gates and the common source in each active area, is defined as a drain of the trenched flash memory cell.

10. The method of claim 9 wherein the silicon substrate is a silicon-on-insulator (SOI) substrate or a single crystal silicon substrate.

11. The method of claim 9 wherein a P-well is located in the silicon substrate within the memory array area.

12. The method of claim 9 wherein the doped region is a buried $N^+$ doped region.

13. The method of claim 1 wherein the dielectric layer is an ONO dielectric layer.

14. The method of claim 9 wherein the floating gate is composed of doped polysilicon.

15. The method of claim 9 wherein a second ion implantation process is performed after the SAS etching process, and using the SAS as a mask.

16. The method of claim 9 wherein programming and erasing over of the trenched flash memory cell involves the use of the Fowler Nordheim tunneling effect.

* * * * *